United States Patent [19]

Kong et al.

[11] Patent Number: 5,448,014
[45] Date of Patent: Sep. 5, 1995

[54] MASS SIMULTANEOUS SEALING AND ELECTRICAL CONNECTION OF ELECTRONIC DEVICES

[75] Inventors: Alvin M. Kong, Los Angeles; James C. Lau, Torrance; Steven S. Chan, Alhambra, all of Calif.

[73] Assignee: TRW Inc., Redondo Beach, Calif.

[21] Appl. No.: 9,530

[22] Filed: Jan. 27, 1993

[51] Int. Cl.$^6$ .............................................. H05K 5/06
[52] U.S. Cl. .................... 174/52.3; 29/832
[58] Field of Search ............ 174/52.3, 52.2, 51, 174/52.1, 52.4, 52.5; 29/832, 825, 830, 860; 257/678, 704, 774

[56] References Cited

U.S. PATENT DOCUMENTS

| | | | |
|---|---|---|---|
| 3,784,883 | 1/1974 | Duncan et al. | 174/52.1 X |
| 4,369,330 | 1/1983 | Pilz | 357/74 X |
| 4,734,608 | 3/1988 | Takoshima | 310/313 R |
| 4,833,102 | 5/1989 | Byrne et al. | 437/218 |
| 4,924,589 | 5/1990 | Leedy | 29/832 |
| 5,047,711 | 9/1991 | Smith et al. | 324/158 R |
| 5,166,773 | 11/1992 | Temple et al. | 257/678 |
| 5,254,871 | 10/1993 | Benavides et al. | 174/52.4 X |
| 5,325,573 | 7/1994 | Miyashita et al. | 29/25.35 |
| 5,369,057 | 11/1994 | Lee et al. | 437/209 |
| 5,373,627 | 12/1994 | Grebe | 29/841 |

FOREIGN PATENT DOCUMENTS

2579829 10/1986 France .

OTHER PUBLICATIONS

Journal of the Electrochemical Society, vol. 113, No. 12, Dec. 1966, Manchester, N.H., pp. 1282–1288, L. Bernstein "Semiconductor Joining by the Solid-Liquid Interdiffusion (SLID) Process".

*Primary Examiner*—Leo P. Picard
*Assistant Examiner*—Christopher Horgan

[57] ABSTRACT

The present invention provides a new and effective method for the sealing and electrical testing of electronic devices; and particularly for surface acoustic wave devices. In accordance with the present invention, the cost and size of making hermetically sealed packages for electronic devices and of electrically testing each device is significantly reduced over the prior art by making use of mass simultaneous sealing and electrical connection at the wafer level, and by using substrates with hermetically sealed and electrically conductive via holes. Further, cost reduction is effected by making use of final electrical testing with wafer probe test techniques before dicing.

22 Claims, 2 Drawing Sheets

MASS SIMULTANEOUS SEALING AND ELECTRICAL CONNECTION OF ELECTRONIC DEVICES

BACKGROUND OF THE INVENTION

This invention relates to the mass simultaneous sealing and electrical connection of electronic devices. Note particularly, the invention relates to a new and economically efficient method of making relatively inexpensive hermetically sealed packages for surface acoustic wave devices.

Many electronic devices are very sensitive and need to be protected from harsh external ities, including various potentially damaging contaminants, present in the environment. Heretic packages have proven to be a very effective means for providing such protection. The seal of a heretic package is an airtight one. Known heretic packages have been made from metal, glass, or ceramic, and a means of sealing, such as solder or welding. Nonhermetic structures have also been used for affording a degree of protection to electronic devices not requiring a complete isolation from the environment. Known nonhermetic packages have employed plastic encapsulation, molding, potting, or polymer sealing. In the past, a trade-off has been required between using heretic packages, which have afforded a maximum degree of protection at a higher cost, and using nonhermetic packaging, which has offered less protection at a lower cost. The reason for the high cost of heretic packages will become apparent from the exemplary description of a prior method of making such structures, which is set forth next.

Customarily, the individual electronic devices to be sealed are initially constructed. The electronic devices are then mounted inside of a package which is suitable for hermetic sealing, typically made of metal and glass or ceramic components as stated above. Next, conductive wire or ribbon bonding is performed between electrical terminals located inside of the package and terminals of the electrical device itself. Such connections enable each electronic device to electrically communicate with a region outside of the package. Subsequently, the package is sealed by metal bonding techniques, such as projection welding or seam sealing. Finally, each individual package and part are electrically tested to determined electrical specifications. Such testing is necessary since the various steps carried out during production usually causes the yield of each unit to drop below one hundred percent. These steps for hermetic packaging and electrical testing have commonly been carried out individually (i.e., one by one) for each electronic device.

The combined cost of the labor to carry out these operations for an individual electronic device together with the cost of the packaging oftentimes far exceeds the cost of the electronic device itself. There has long existed, therefore, a recognized need for a less expensive method for hermetically sealing electronic devices from the external environment; and also, a need for being able to electrically test them in an economically efficient manner. Additionally, due to the complexity of the assembly, such operations have lead to a device which can be undesirably large in size.

One example of an electronic device which is preferably hermetically packaged for use due to its sensitive nature, and which has been commonly packaged in a manner such as that set forth above, is a surface acoustic wave (SAW) device. SAW devices are well known in the art and are extremely useful in a number of different applications, including highly accurate and stable band pass filters and oscillators operating from tens of MHz to beyond 1 GHz.

Environmental contaminants can cause SAW devices to seriously malfunction, often to the point that they are rendered useless for their intended purpose. For example, contamination of a SAW device can change the acoustic wave propagation velocity and increase attenuation through the SAW substrate. For SAW devices, any change in velocity results in frequency shift, and an increase in attenuation results in increasing insertion loss. Thus, hermetic packaging for each individual SAW device has routinely been utilized in order to ensure that the surface of each device is kept free of contaminants that could reflect or otherwise interfere with propagating surface acoustic wave energy.

As stated above, however, the known methods for hermetically encapsulating electronic devices (such as SAW devices) have proven expensive and can result in the production of units which are often undesirably large in size.

It is, therefore, a primary object of the present invention to provide a new and effective method for the sealing and electrical testing of electronic devices; and particularly for surface acoustic wave devices.

It is also an object of the invention to provide a highly cost efficient method capable of producing either a hermetic package or a nonhermetic package, whichever is desired in a particular instance, for an electronic device.

It is additionally an object of the invention to provide a method for producing a surface mount compatible device which is compact in size.

SUMMARY OF THE INVENTION

The present invention provides a method of mass sealing and testing electronic devices, including the steps of:

(a) initially aligning a cover wafer having a plurality of electrically conductive elements therein over a plurality of electronic devices supported at a substrate wafer;

(b) next both:
  (i) sealing each electronic device by bonding the aligned cover wafer against the substrate wafer; and,
  (ii) forming an electrical communication between the electrically conductive elements in the cover wafer and the electronic devices supported at the substrate wafer; and, (c) finally testing the plurality of sealed electronic devices.

An optional solder coating may be provided on an outer side of the cover wafer, before the testing step, in order that the finished package will be conveniently ready for a subsequent solder attachment operation during next-level assembly procedures.

The present invention also provides a relatively small, surface mount compatible, hermetically sealed package for a surface acoustic wave device formed in accordance with the method just set forth.

The invention additionally provides a wafer level package comprising a substrate wafer and a plurality of electronic devices. The electronic devices are supported by the substrate wafer. A cover wafer is bonded against the substrate wafer over the electronic devices. A grid of a bonding material layer (alone, or along with one or more additional layers, such as a layer of a barrier material) is patterned upon the substrate wafer and/or the cover wafer in a manner separating each one of the electronic devices supported by the substrate wafer from the remaining of the electronic devices supported by the substrate wafer. The bonding material and the cover wafer aid in forming a seal for substantially each one of the electronic devices at the wafer level. A plurality of electrically conductive elements are provided in the cover wafer. The electrically conductive elements are in electrical communication with the electronic devices at the wafer level.

DETAILED DESCRIPTION OF THE PREFERRED EMBODIMENT

In accordance with the present invention, the cost and size of making hermetically sealed packages for electronic devices and of electrically testing each device is significantly reduced over the prior art by making use of mass simultaneous sealing and electrical connection at the wafer level, and by using substrates with hermetically sealed and electrically conductive via holes. Further, cost reduction is effected by making use of final electrical testing with wafer probe test techniques before dicing.

Figure 1:
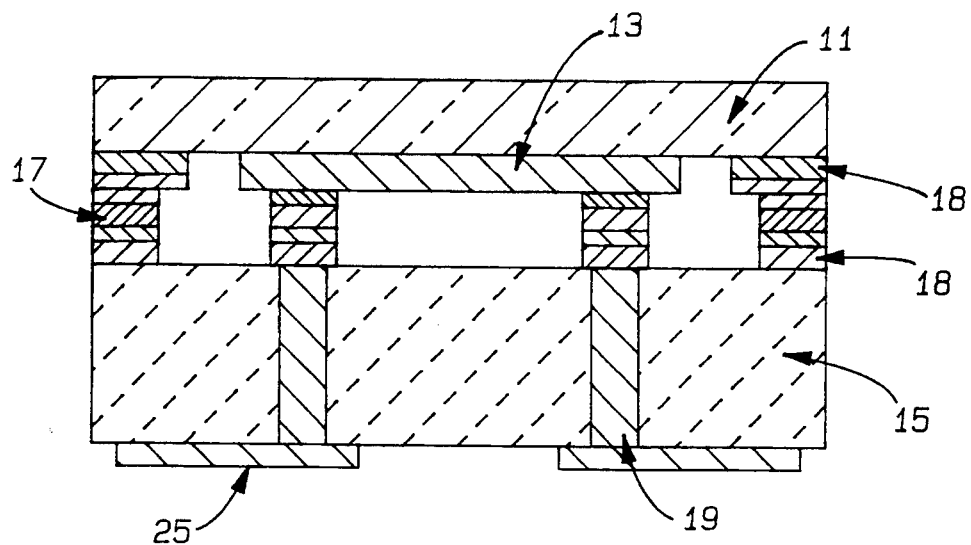
FIG. 1 is a side cross-sectional view of an electronic device in a sealed package, as constructed in accordance with an embodiment of the present invention.
Figure 2:
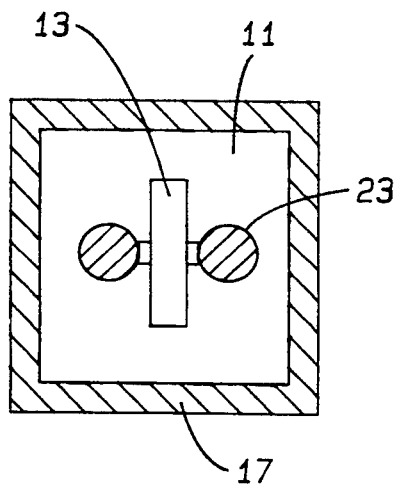
FIG. 2 is a view from the bottom of the device substrate, prior to its attachment to the cover substrate.
Figure 3:
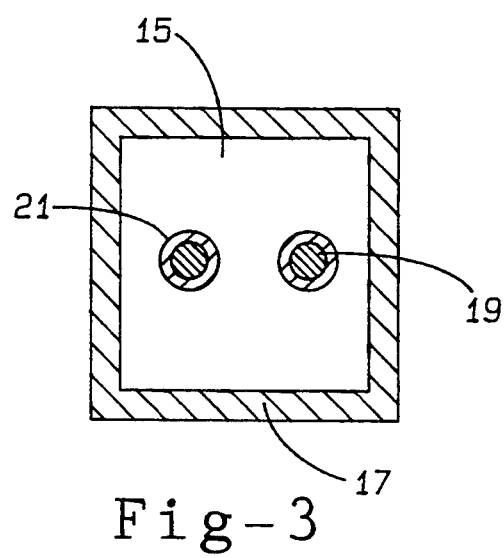
FIG. 3 is a view from the top of the cover substrate, prior to its attachment to the device substrate.

Details of the invention are next described with initial reference to FIGS. 1, 2 and 3. FIG. 1 illustrates an electronic device in a sealed package, as constructed in accordance with an embodiment of the present invention. FIG. 2 is a view from the bottom of a device substrate, prior to its attachment to a cover substrate. FIG. 3 is a view from the top of the cover substrate, prior to its attachment to the device substrate.

A hermetically sealed package containing an electronic device, made in accordance with the method of the invention and as shown in the Figures, includes a device substrate wafer 11 supporting an electronic device 13. The device substrate wafer 11 may suitably be comprised of quartz, and the electronic device 13 may be a surface acoustic wave (SAW) device. The device substrate wafer 11 is covered with a cover substrate wafer 15, which is capable of providing a hermetic seal. A suitable material for forming such a cover substrate wafer 15 is a type of ceramic material (A particularly suitable material is a type of FOTOCERAM (Trademark of Corning Glass)). The materials just discussed are particularly good for use in the package of the invention; however, other suitable materials may be used instead.

It should be noted that a polymer material may be employed (e.g., comprising a substrate wafer) in making the package of the present invention. Polymers, which are not regarded as usable for forming hermetic seals, are particularly attractive since they are generally inexpensive. Although a polymer material may not allow the achievement of a hermetically sealed package, the polymer could nevertheless provide good protection against certain particulates. Thus, it may be preferable to utilize a polymer material where a hermetic seal is not required.

The device substrate wafer 11 is attached to the cover substrate wafer 15 by way of a grid of solder strips 17. The solder strips 17 are bonded to both the device substrate wafer 11 and the cover substrate wafer 15, as can be seen in FIGS. 2 and 3 respectively. In addition to bonding the two substrates 11 and 15 together, the solder strips 17, as shown in FIG. 1, additionally serve to keep the surface of the cover substrate wafer 15 slightly separated from the surface of the device substrate wafer 11, upon which the electronic device 13 is located. A layer of a separator material between the substrate and the solder also can be used for aiding in such separation (i.e., to control the distance between the substrate wafers). The separator layer can be comprised of any suitable material. In instances where the separator is only utilized for separation purposes, without any other specific performance demands placed upon it, the choice of materials for forming it can be quite broad. In other instances it may be desired to have the separator layer act as a barrier, thus a separator/barrier layer 18 may be utilized as shown in FIG. 1. Any known materials for forming barrier layers may be employed in the invention. As examples, tungsten or nickel could be used in forming the barrier layer. It is to be noted that more than one separator/barrier layer may be utilized. As can be discerned from FIG. 1 and the description just set forth, it is contemplated that multiple layers may be formed upon either of the substrates; additional layers not specifically described herein may be employed as needed utilizing any suitable layer materials known in the art which are acceptable for accomplishing the desired purposes.

Conductive vias (also referred to as conductive through holes) 19 extend through the cover substrate wafer 15. Solder terminals 21 associated with the conductive vias 19 are bonded to solder terminals (also referred to as bonding pads) 23 of the electronic device 13. Such electrical interconnection of the electronic device 13 to the vias 19 is desirable so that the electronic device can communicate electrically outside of the package, defined by the two substrate wafers and solder bonds once sealing has been completed, by way of external electrical terminals 25. In order to provide a hermetically sealed device, the conductive vias 19 are constructed to be hermetic. The assembled device, as shown in FIG. 1, is suitable for attachment to circuit boards in a surface mount process by placing it on such a board with its cover side down.

It is noteworthy that the separator/barrier layers 18 can be useful in preventing elements of the vias 19 (such as gallium or mercury) from getting into the rest of the unit.

Importantly, the present invention provides a highly efficient and effective method for producing sealed electronic devices as shown and described with reference to FIGS. 1 through 3. The method as contemplated by the invention will now be described, with additional reference to FIGS. 4 through 6.

Figures 4A, 4C:
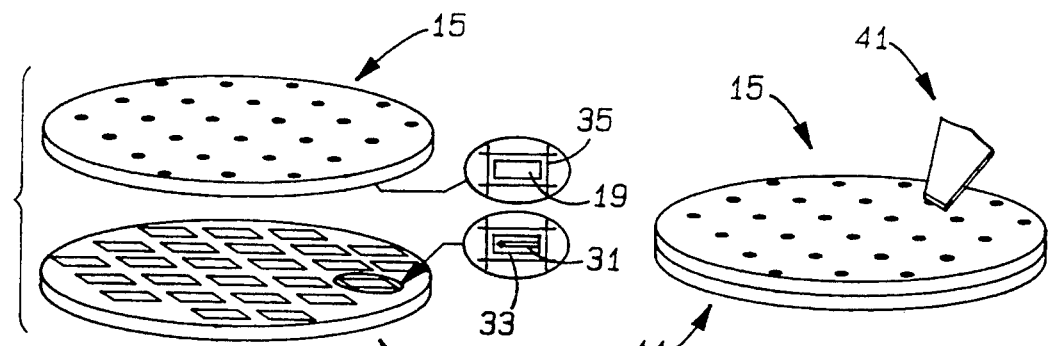
FIGS. 4(A) through 4(D) show a sequence of process steps of an embodiment of the method of the present invention, which steps together are useful for economically producing relatively small electronic devices in sealed packages.

As shown in FIG. 4(A), a cover substrate wafer 15 is initially aligned with respect to a device substrate wafer 11. (To avoid any confusion, it should be noted at this point that the reference numerals 11 and 15 are employed herein as reference characters for the wafer substrates both before they have been diced into individual units (i.e., while still at the wafer level), as well as after they have been diced to produce single individual packages as shown in FIGS. 1 through 3.) Typically, each of the two substrate wafers 11 and 15 are three inches in diameter (though it is to be understood that they may be smaller or larger). The device substrate wafer 11 supports a plurality of SAW transducers 31 (or other suitable desired electronic devices). The cover substrate wafer 15 is provided with a plurality of hermetic conductive vias 19 therein, arranged in a manner so as to correspond to each of the SAW devices 31 in the device substrate wafer 11. The wafers are thus aligned so that contacts of each of the SAW devices 31 are aligned with the conductive vias 19 (See FIG. 4(A)) or pads connected to the vias.

Figures 4B, 4D:
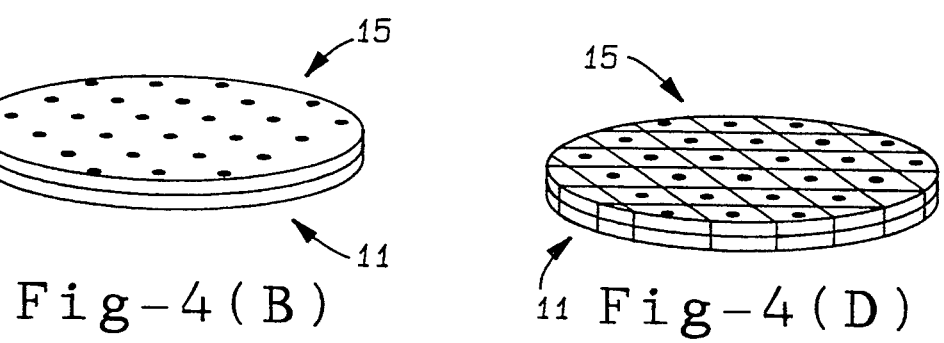

The cover substrate wafer 15 is then bonded to the device substrate wafer 11 by a suitable means, as shown in FIG. 4(B). Preferably, the bond is formed between a grid of gold solder strips 33 previously formed upon the device substrate wafer 11, about the SAW devices, and a similarly patterned grid of indium solder strips 35 previously formed upon the cover substrate wafer 15, about the via contacts 19. The bond is preferably a hermetic solid liquid interdiffusion (SLID) bond formed between the gold and indium layers. Details of the bonding are discussed below. By way of such bonding, a hermetic sealing of the SAW devices 31 is thereby effected.

Simultaneously with the bonding step, just set forth, electrical connections are made between the SAW devices 31 in the device substrate wafer 11 and the adjacent conductive vias 19 in the cover substrate wafer 15. As shown in FIG. 4(C), the resulting "sandwich" wafer can then be electrically tested to desired electrical specifications, from the cover side, by way of a conventional automatic wafer probe station 41. It is to be noted that such testing is carried out at the wafer level (i.e., before the wafers are diced into individual package units).

Figure 5:
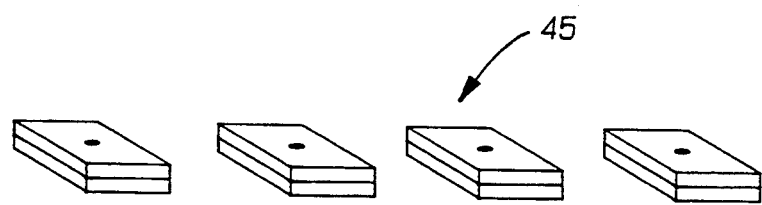
FIG. 5 shows a plurality of relatively small electronic devices in sealed packages produced by the method depicted in FIGS. 4(A) through 4(D).

With reference to FIG. 4(D), the wafers 11 and 15 are subsequently diced using conventional substrate dicing saws (not shown). The resulting hermetically sealed, electrically tested, and diced hermetic packages 45, each containing a SAW device, are then complete and ready to ship as shown in FIG. 5. Each three inch diameter wafer pair, 11 and 15, is capable of yielding a few hundred devices.

An optional solder coating (plate or wave soldering) may be formed on an outer side of the cover wafer, before the testing step, in order that the finished package will be conveniently ready for a subsequent solder attachment operation during next-level assembly procedures. Providing the solder coating prevents users of the package from having to provide solder for each individual unit at a later time when it is desired to employ the units in such next-level assembly procedures. It should be appreciated that it is much simpler to provide such a solder coating while at the wafer level as opposed to applying it for each of the many individual units which are ultimately made. Suitably, the solder layer or plate is provided on an outer side of the external terminals 25.

It is important to the process just set forth, to select for the cover substrate wafer 15 an electrically nonconductive material which possesses thermal expansion characteristics closely matching the thermal expansion characteristics of the device substrate wafer 11. A SAW resonator using an ST cut quartz wafer, for example, has a linear thermal expansion coefficient of 13.7 ppm per degree Celsius in the X axis and 10.2 ppm per degree Celsius perpendicular to the X axis of the crystal. Some types of glass-ceramic products having a thermal expansion coefficient of 12 ppm per degree Celsius match the ST cut quartz wafer reasonably well. A type of FOTOCERAM (Trademark of Corning Glass), for example, is one such suitable product.

Additionally, in instances where it is necessary to produce a hermetically sealed package, it is important to ensure that the cover substrate wafer 15 has hermetically sealed conductive vias 19 therein to connect the electronic device 13 within the package to the outside electrically.

Also with regard to the above process, it is important that the bonding together of the two wafers 11 and 15 be carried out at a relatively low temperature so that potential thermal stresses incurred upon cooling, due to any mismatch in the thermal expansion characteristics between them, will be kept to a minimum. It is additionally important to produce a bond with a high melting temperature so that the bond, once formed, will not subsequently melt in later assembly processes (e.g., a later surface mount process on a printed circuit board).

Figure 6:
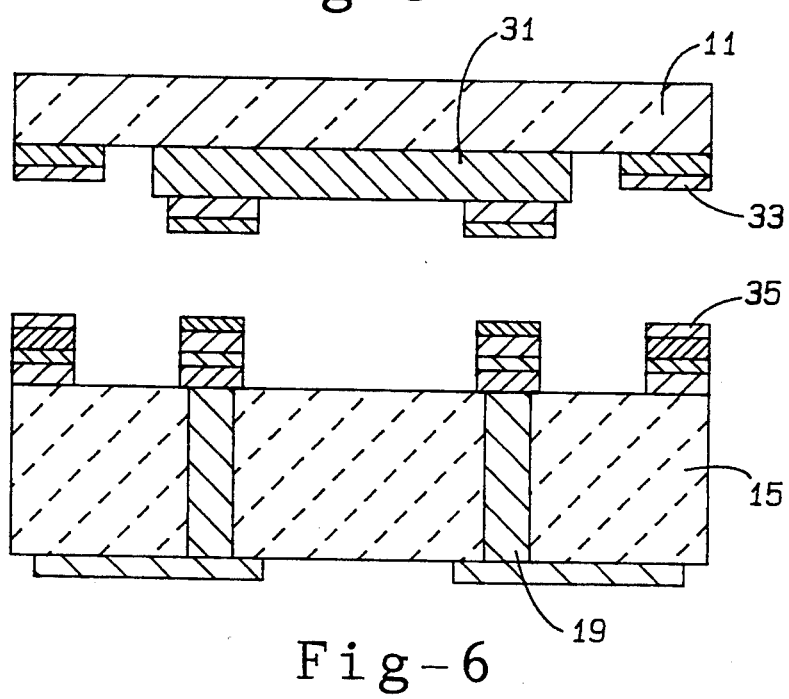
FIG. 6 is a side cross-sectional view of a cover substrate aligned with a device substrate prior to bonding the two substrates together by way of a solder grid patterned upon them, as taught by the present invention. Suitable materials comprising the cover and device substrates are detailed hereinafter.

To meet these goals, it is contemplated by the present invention to accomplish the bonding between a gold grid patterned upon one of the substrate wafers and an indium grid patterned upon the other of the two substrate wafers. FIG. 6 is a side cross-sectional view of a ceramic cover substrate aligned with a quartz device substrate prior to bonding the two substrates together by way of such solder grids patterned upon them. Preferably, for ease of processing, the gold grid is formed upon the substrate wafer which supports the electronic devices and the cover substrate wafer is patterned with the indium grid. When the two substrate wafers 11 and 15 are put together under a dry gas (e.g., hydrogen or nitrogen) or vacuum, and heated, the indium melts at 155 degrees Celsius and begins to mix with the gold. When the gold concentration is high enough, the melt passes through a phase transition and becomes solid (Attention is hereby directed to: L. Bernstein, "Semiconductor Joining by the Solid-Liquid-Interdiffusion (SLID) Process: 1. The Systems Ag-In, Au-In, and Cu-In," in the *Journal of the Electrochemical Society*, Vol. 113, No. 12 (December 1966) at pages 1282–1288). After this solid is annealed, and with a proper ratio of gold and indium (e.g., 30 to 40 percent weight of indium), the bond will not melt below 400 degrees Celsius. Such bond melting temperature is considerably higher than the normal printed circuit board soldering temperature which is less than 250 degrees Celsius.

It is to be noted that the concept of the invention can also be extended to electronic devices that do not need to be sealed hermetically. In such a case, more easily processed and/or less expensive materials can be utilized; for example, nonhermetic vias could be employed, and polymeric materials could be used for the substrates. It should also be noted that the invention can be employed in place of existing methods of electronic packaging.

It is to be understood that the foregoing description is primarily intended to be exemplary, in particular to provide the preferred embodiments of the invention as contemplated by the inventors, and is not meant to be limiting. Accordingly, various changes and modifications may be made without departing from the spirit and scope of the invention, as defined by the appended claims.

It is claimed:

1. A method of mass sealing and testing electronic devices, comprising the steps of:
   (a) initially aligning a cover wafer having a plurality of electrically conductive elements therein over a plurality of individual electronic devices supported at a single substrate
   (b) next both:
      (i) sealing each electronic device by bonding the aligned cover wafer against the substrate wafer; and,
      (ii) forming an electrical communication between the electrically conductive elements in the cover wafer and the electronic devices supported at the substrate wafer; and,
   (c) finally testing the plurality of sealed electronic devices;
   wherein steps (b)(i) and (b)(ii) both take place while at the wafer level.

2. The method of claim 1 further comprising a step, subsequent to step (c), of dicing the wafer-level bonded wafers into a plurality of individual sealed packages each containing a tested electronic device.

3. The method of claim 1 wherein step (c) includes a wafer probe electrical testing technique.

4. The method of claim 1 wherein the cover wafer comprises an electrically nonconductive material having thermal expansion characteristics similar to the thermal expansion characteristics of the substrate wafer.

5. The method of claim 4 wherein the substrate wafer is quartz and the cover wafer is glass-ceramic.

6. The method of claim 4 wherein sealing step (b)(i) results in the formation of a hermetic seal about each of the electronic devices.

7. The method of claim 6 wherein the plurality of electrically conductive elements in the cover wafer comprise hermetically sealed conductive vias which are adapted to connect the electronic devices to external electrical terminals.

8. The method of claim 1 wherein the sealing step (b)(i) is carried out at a relatively low temperature and during which step the cover wafer is attached to the substrate wafer by a grid of solder strips patterned about each electrical device; wherein patterning of the grid is carried out prior to the sealing step (b)(i); and wherein said relatively low temperature is less than 200 degrees Celsius.

9. The method of claim 8 wherein the grid of solder strips maintains a separation between the substrate wafer and the cover wafer.

10. The method of claim 8 wherein the sealing step (b) (i) results in the formation of a hermetic solid liquid interdiffusion bond.

11. The method of claim 10 wherein the hermetic solid liquid interdiffusion bond is formed between a gold grid patterned upon one of the wafers and an indium grid patterned upon the other of the two wafers; wherein patterning of the grids is carried out prior to the sealing step (b)(i).

12. The method of claim 8 wherein the recited dicing step comprises dicing the bonded and tested wafers down center lines of the grid of solder strips.

13. The method of claim 12 wherein the seal formed by the sealing step (b)(i) is a hermetic seal.

14. The method of claim 13 wherein the electronic devices are surface acoustic wave devices.

15. A wafer level package comprising: a single substrate wafer and a plurality of individual electronic devices, wherein said electronic devices are supported by said substrate wafer at the wafer level; a cover wafer bonded against said substrate wafer over said electronic devices; a grid of bonding material patterned upon said substrate wafer in a manner separating each one of said electronic devices supported thereby from the remaining of said electronic devices supported thereby; wherein said bonding material and said cover wafer aid in forming a seal for substantially each cue of said electronic devices at the wafer level; a plurality of electrically conductive elements in said cover wafer, wherein said electrically conductive elements are in electrical communication with said electronic devices at the wafer level.

16. The wafer level package of claim 15 wherein each of said substrate wafer and said cover wafer are at least one inch wide.

17. The wafer level package of claim 15 wherein the seal is a hermetic seal; and wherein the cover wafer comprises an electrically nonconductive material having thermal expansion characteristics similar to the thermal expansion characteristics of the substrate wafer; and wherein the plurality of electrically conductive elements in the cover wafer comprise hermetically sealed conductive vias.

18. The wafer level package of claim 17 wherein the electronic devices are surface acoustic wave devices.

19. The method of claim 1 further comprising a step prior to step (c) of forming a solder layer on an outer side of one of said wafers for subsequent use in solder attachment procedures.

20. The method of claim 9 further comprising a multiple layer grid, wherein said solder strips comprise at least one layer of said grid; and wherein said multiple layer grid additionally includes a barrier layer, wherein said barrier layer at least in part aids in maintaining the separation between the substrate wafer and the cover wafer.

21. The method of claim 1 wherein the steps (b)(i) and (b)(ii) both take place essentially concurrently.

22. The wafer level package of claim 15 wherein the electronic devices are surface acoustic wave devices.

* * * * *